(12) United States Patent
Ikeya et al.

(10) Patent No.: US 6,251,696 B1
(45) Date of Patent: Jun. 26, 2001

(54) METHOD OF FORMING INTEGRATED CIRCUIT WITH EVALUATION CONTACTS ELECTRICALLY CONNECTED BY FORMING VIA HOLES THROUGH THE CHIP, AND BONDING THE CHIP WITH A SUBSTRATE

(75) Inventors: Masahisa Ikeya; Kazuyuki Inokuchi, both of Tokyo (JP)

(73) Assignee: Oki Electric Industry, Co. Ltd., Tokyo (JP)

( * ) Notice: Subject to any disclaimer, the term of this patent is extended or adjusted under 35 U.S.C. 154(b) by 0 days.

(21) Appl. No.: 09/426,184

(22) Filed: Oct. 25, 1999

Related U.S. Application Data

(62) Division of application No. 08/864,860, filed on May 29, 1997.

(30) Foreign Application Priority Data

Oct. 16, 1996 (JP) ....................................... 8-273512

(51) Int. Cl.$^7$ ....................................... H01L 21/66
(52) U.S. Cl. ............................ 438/17; 438/112; 438/128; 438/455; 438/10
(58) Field of Search ............................. 438/105, 18, 14, 438/15, 17

(56) References Cited

U.S. PATENT DOCUMENTS

| | | | |
|---|---|---|---|
| 5,158,911 | * 10/1992 | Quentin | 438/667 |
| 5,512,710 | 4/1996 | Schroder | 174/524 |
| 6,002,177 | * 12/1999 | Gaynes et al. | 257/774 |

FOREIGN PATENT DOCUMENTS

| | | |
|---|---|---|
| 3 123 023 | 12/1982 | (DE) . |
| 2 094 552 | 9/1982 | (GB) . |

* cited by examiner

*Primary Examiner*—Charles Bowers
*Assistant Examiner*—William M. Brewster
(74) *Attorney, Agent, or Firm*—Venable; Norman N. Kunitz

(57) ABSTRACT

A method of fabricating an integrated circuit of which a bonding condition can be evaluated simply is provided. Two external connecting electrodes are provided on the surface, via holes are formed below them, and conductive portions are formed in the via holes. Then, a first metal film is formed on a rear face of a chip and a second metal film is formed on a surface of a ceramic substrate, and then both of them are made contact and heated so as to bond the chip and the ceramic substrate. Further, when the first metal film is formed, a slit portion which no first metal film exists is provided. When the bonding condition is evaluated, a resistance between two external connecting electrodes is measured.

5 Claims, 8 Drawing Sheets

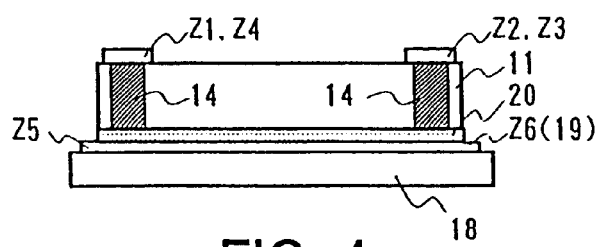
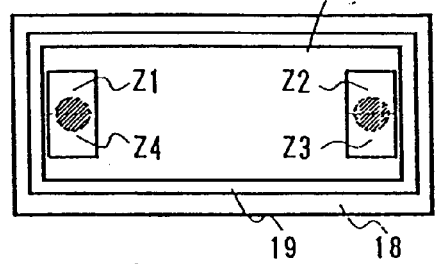
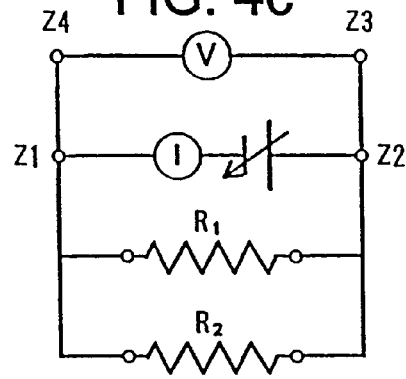
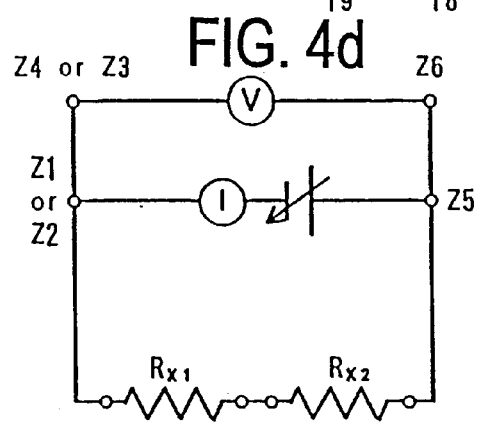
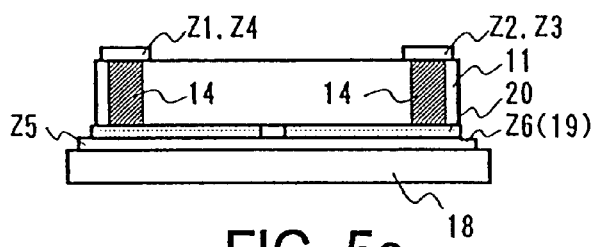
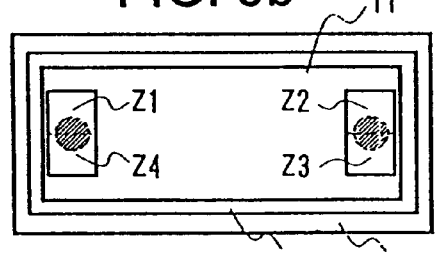
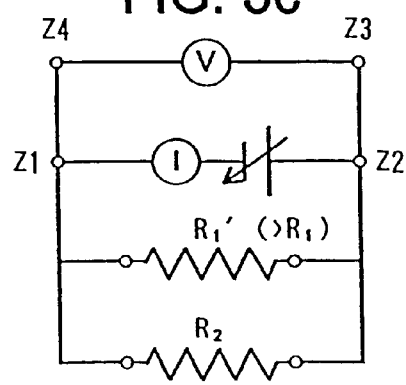
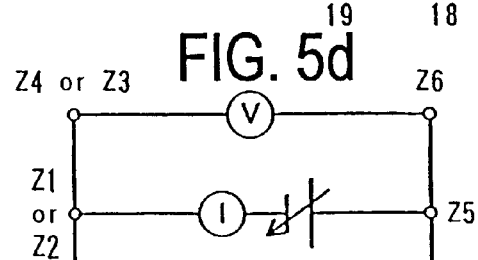

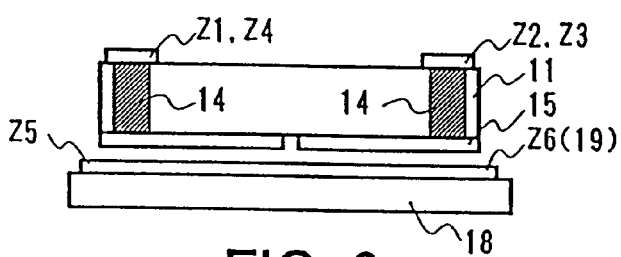
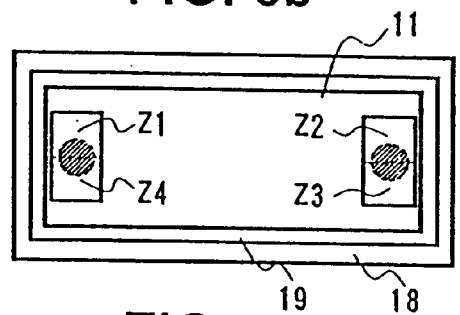
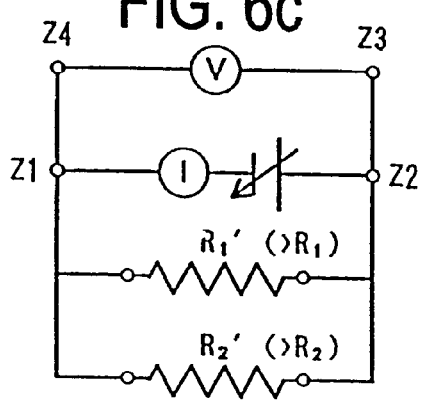
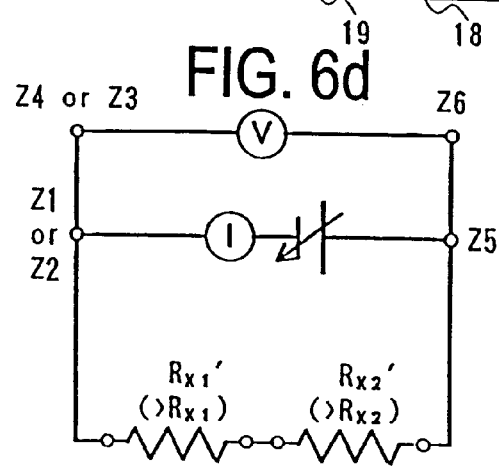

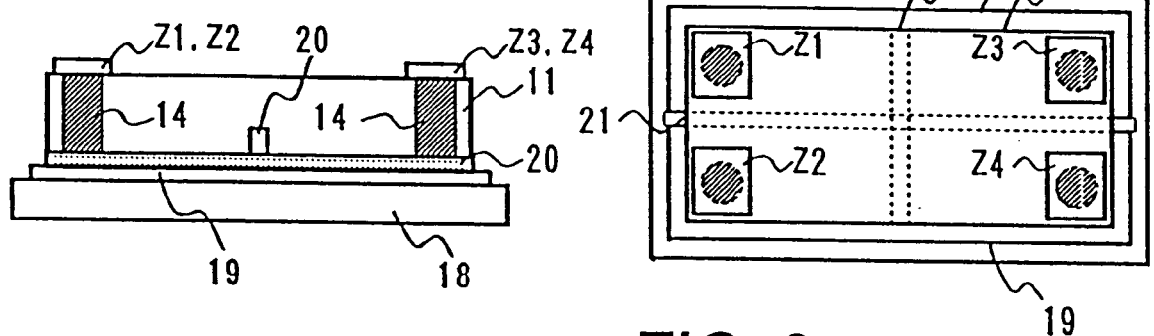
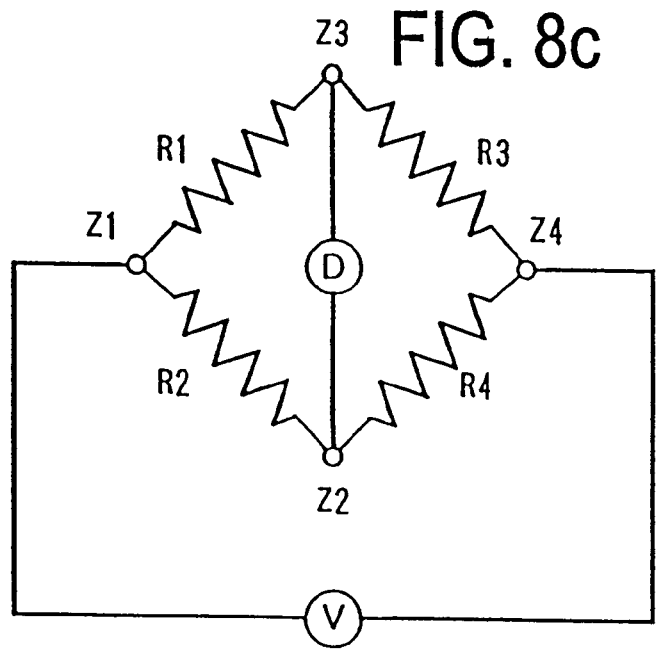

FIG. 9
PRIOR ART
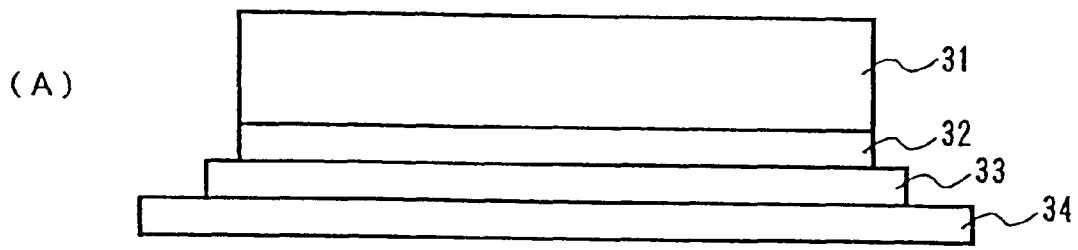
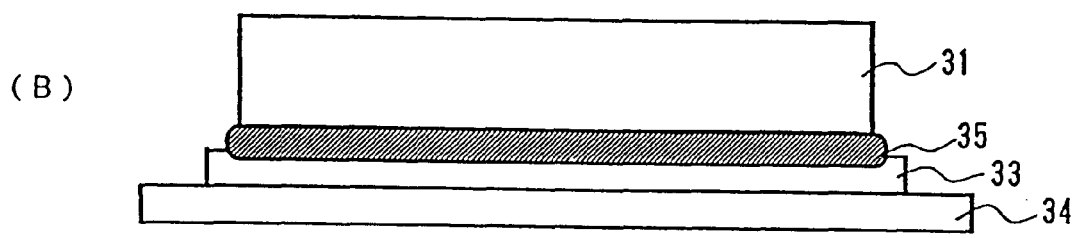
FIG. 10
PRIOR ART
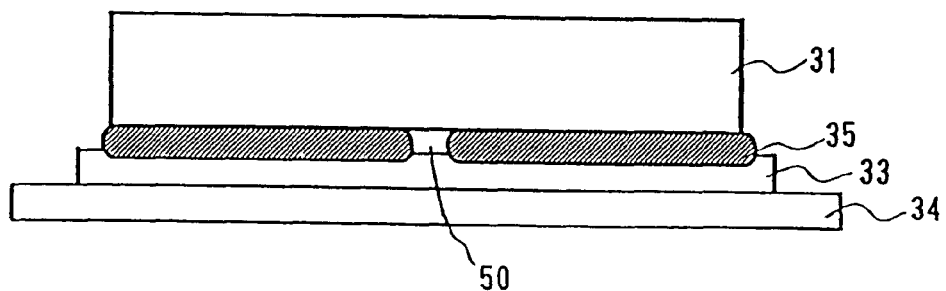

METHOD OF FORMING INTEGRATED CIRCUIT WITH EVALUATION CONTACTS ELECTRICALLY CONNECTED BY FORMING VIA HOLES THROUGH THE CHIP, AND BONDING THE CHIP WITH A SUBSTRATE

This application is a division of Ser. No. 08/864,860 filed May 29, 1997.

BACKGROUND OF THE INVENTION

1. Field of the Invention

The present invention relates to an integrated circuit, a fabricating method for the integrated circuit and an evaluating method for the integrate circuit, more particularly, to an integrated circuit including an IC (integrated circuit) chip using a semi-insulating substrate and a ceramic substrate on which the IC chip is put and the integrated circuit which can be evaluated as to a bonding condition between the IC chip and the substrate, and to a fabricating method and an evaluating method thereof.

2. Description of the Related Art

As known, when an integrated circuit is fabricated, a processing step called die bonding is performed. The die bonding is a step where a chip (also called a die) divided in a dicing step is fixed to a substrate. It is known that there are three bonding methods such as paste bonding, solder bonding and eutectic bonding.

In an integrated circuit fabricated by mounting an IC chip using a semi-insulator such as GaAs or InP on a ceramic substrate, there are many cases where solder bonding and eutectic bonding are used for bonding the IC chip and the ceramic substrate. In solder bonding, a foil of low melting point alloy (namely, solder) is put between the chip and the substrate. Then, the foil is reflowed by heating, whereby the chip and the ceramic substrate are bonded. Additionally, in solder bonding, for example, when the wettability of the solder is not good for the chip materials or a ceramic substrate, films including materials of which the wettabilities are good are previously formed on one or both of the bonding surfaces of the chip and the ceramic substrate by a vacuum evaporation method or the like.

In eutectic bonding, the chip and the ceramic substrate are bonded by using a diffusion reaction between two elements which form a eutectic alloy. That is, in eutectic bonding, as shown in FIGS. 9(A) and 9(B), a bonding surface of a chip 31 is provided with a film 32 including one of the two elements to be the eutectic alloy and a bonding surface of a ceramic substrate 34 provided with a film 33 including the other of the two elements are brought into contact (see FIG. 9(A)) and heated temporarily, so that the chip 31 and the ceramic substrate 34 are bonded by a eutectic alloy 35 (and the film 33) (see FIG. 9(B)). In FIGS. 9(A) and 9(B), all of the film 32 is changed into a eutectic alloy, however, there is a chance that at least a portion of the film 32 remains.

In solder bonding or eutectic bonding, a bonding portion with very small thermal resistance can be formed. In eutectic bonding, however, as shown in FIG. 10, there is a chance that the eutectic alloy layer 35 is not evenly formed, so that a defect such as a cavity 50 is formed between the chip 31 and the ceramic substrate 34. In the solder bonding, there is also a that a cavity 50 is formed in a bonding portion.

In an integrated circuit like that shown in FIG. 10, a thermal resistance between the chip 31 and the ceramic substrate 34 (particularly, around the cavity 50) is high.

Therefore, when this integrated circuit operates, the temperature of the chip 31 raises compared with an integrated circuit in which a bonding portion in normally formed as shown in FIG. 9(B).

Particularly, in an IC chip using a semi-insulating or insulating substrate such as GaAs (gallium arsenide), InP (indium phosphoide) and sapphire, the thermal conductivity of the substrate is low. Therefore, when the chip is not normally bonded to the ceramic substrate, the circuit fabricated on the chip does not operate normally because of the increased temperature.

Thus, it is desirable to identify integrated circuits which are not normally bonded. In conventional integrated circuits, a bonding condition is evaluated only by measuring the force required to peel the chip from the ceramic substrate or measuring the actual thermal resistance. The former is a destructive inspection, and therefore bonding conditions of the integrated circuits can not be evaluated individually by the former method. The latter is a non-destructive inspection, and can be used for integrated circuits individually, but, it takes a long time to measure the thermal resistance. Thus, in the latter method, there is no choice except for that some of a plurality of integrated circuits are evaluated as samples.

SUMMARY OF THE INVENTION

Accordingly, it is an object of the present invention to provide an integrated circuit whose bonding state can be simply evaluated. It is another object of the present invention to provide a fabricating method of an integrated circuit whose bonding state can be simply evaluated.

To solve the above described problems, according to the present invention, an integrated circuit, which comprises a semiconductor chip having active elements on a main face, a substrate having an electrode on a main face and a bonding layer formed by alloying the electrode and a conductive member lying between a rear face of the semiconductor chip opposite to the main face of the semiconductor chip and the main face of the substrate, is fabricated with the semiconductor chip including at least two surface electrodes formed on its main face, and connection wiring portions provided by filling at least two holes respectively formed below the surface electrodes so as to penetrate the semiconductor chip from the main surface to the rear face of the semiconductor chip with conductive materials.

According to the integrated circuit fabricated like this, a resistance between the surface electrodes provided on the semiconductor chip is measured, whereby the bonding condition between the semiconductor chip and the substrate can be evaluated. Therefore, when all integrated circuits are fabricated to have this structure, it can be determined simply whether each circuit is inferior or not.

Moreover, when the integrated circuit of the present invention is fabricated, a semiconductor chip which has a slit dividing a surface of the rear face into two may be used, and surface electrodes provided with an area capable of being touched with at least two external terminals may be used.

A first fabricating method of an integrated circuit is that of an integrated circuit including a semiconductor chip having active elements on a main face and a substrate having an electrode on a main face. The method comprises (a) forming at least two surface electrodes on the main face of the semiconductor chip, (b) forming connection wiring portions by making holes penetrating the semiconductor chip from a rear face opposite to the main face to the surface electrodes on the main surface and filling the holes with conductive materials, (c) forming two separated conductive members on the rear face of the semiconductor chip, and (d) bonding the semiconductor chip with the substrate by putting the semiconductor chip on the substrate in a manner that the rear face of the semiconductor chip is opposite the main face of the substrate and heating them.

According to this fabricating method, a resistance between the surface electrodes provided on the semiconductor chip is measured, whereby an integrated circuit whose bonding condition between the semiconductor chip and the substrate can be evaluated is fabricated. Therefore, when all integrated circuits are fabricated by this method, it can be determined whether a fabricated integrated circuit is inferior or not. Further, the two alienated separated conductive members are formed. Therefore, when the bonding is not performed normally by any cause, the resistance between the surface electrodes becomes larger than the case in which an even conductive member is provided on the rear face of the semiconductor chip. Thus, it becomes easier to determine whether a circuit is inferior or not. Additionally, when this fabricating method is used, it is desirable that two materials (elements) to be eutectic are used as the electrodes and the conductive members. However, it is also possible to use the same material (low melting point metal or alloy). Further, each of the surface electrodes is formed so as to be provided with an area capable of being contacted with at least two external terminals, whereby it becomes possible to measure a resistance by the so-called four terminal method. Thus, it becomes possible to evaluate the bonding condition under no influence of the contact resistance. That is, though a difference of conditions in bonding portions is slight, an integrated circuit where this difference can be determined can be fabricated.

A second fabricating method of an integrated circuit is that of an integrated circuit including a semiconductor chip having active elements on a main face and a substrate having electrodes on a main face. The method comprises (a) forming four surface electrodes on the main face of the semiconductor chip, (b) forming connection wiring portions by making holes penetrating the semiconductor chip from a rear face opposite to the main face to the surface electrodes and filling the holes with conductive materials, (c) forming a groove portion dividing the surface of the rear face of the semiconductor into two, (d) providing conductive members on the rear face of the semiconductor chip expect for the groove portion, (e) forming the electrodes on the main face of the substrate in a manner that the surface of the main face of the substrate is separated into two parts extending in a direction perpendicular to the groove portion, and (f) bonding the semiconductor chip and the substrate by putting the semiconductor chip on the substrate in a manner that the rear face of the semiconductor chip is opposite to the main face of the substrate and heating them.

According to this fabricating method, it becomes possible to obtain an integrated circuit in which conditions at various ranges in the bonding portion of the chip and the ceramic substrate can be evaluated with the combination of the four surface electrodes provided on the semiconductor chip. It also becomes possible to measure the resistance of the integrated circuit by the four terminal method or a bridge circuit. Therefore, the bonding condition (resistance) can be detected under no influence of the contact resistance.

A first evaluating method of an integrated circuit intends to use an integrated circuit including a semiconductor chip which has active elements on a main face and a substrate which has electrodes on a main face. The integrated circuit is fabricated by (a) a step of forming at least two surface electrodes on the main face of the semiconductor chip, (b) a step of forming connection wiring portions by making holes penetrating the semiconductor chip from a rear face opposite to the main face to the surface electrodes and filling the holes with conductive material, (c) a step of forming two alienated or separated conductive members on the rear face of the semiconductor chip, and (d) a step of bonding the semiconductor chip and the substrate by putting the semiconductor chip on the substrate in a manner that the rear face of the semiconductor chip is opposite to the main face of the substrate and forming a bonding layer with alloying of the conductive materials and the electrodes. Evaluation of a connecting condition between the semiconductor chip and the substrate is carried out by measuring resistance values between the surface electrodes or between one of the surface electrodes and the bonding layer.

A resistance value or the like between the surface electrodes or between one of the surface electrodes and the alloy layer is measured, whereby a condition of an alloy layer generated by alloying, namely, a connecting condition between the semiconductor chip and the substrate, is evaluated.

Additionally, when this evaluating method is performed, it is desirable that each surface electrode is formed with an area capable of being contacted with at least two external terminals, and the connecting condition between the semiconductor chip and the substrate is evaluated by applying a predetermined voltage between the surface electrodes using a pair of the external terminals, and by measuring a voltage drop between the surface electrodes or between one of the surface electrodes and the bonding layer with another pair of the external terminals.

A second evaluating method of an integrated circuit intends to use an integrated circuit including a semiconductor chip which has active elements on a main face and a substrate which has electrodes on a main face. The integrated circuit is fabricated by the following steps (a) forming four surface electrodes on the main face of the semiconductor chip, (b) forming connection wiring portions by making holes penetrating the semiconductor chip from a rear face opposite to the main face to the surface electrodes and filling the holes with conductive materials, (c) forming a groove portion dividing the surface of the rear face of the semiconductor into two, (d) providing conductive members on the rear face of the semiconductor chip expect for the groove portion, (e) forming the electrodes on the main face of the substrate in a manner that the surface of the main face of the substrate is separated into two parts extending in a direction perpendicular to the groove portion, and (f) bonding the semiconductor chip and the substrate by putting the semiconductor chip on the substrate in a manner that the rear face of the semiconductor chip is opposite to the main face of the substrate, and forming a bonding layer by alloying of the conductive materials and the electrodes. Evaluation of a connecting condition between the semiconductor chip and the substrate is carried out by measuring resistance values between the surface electrodes with contacting external terminals to the four surface electrodes in a manner that a bridge circuit is constructed.

BRIEF DESCRIPTION OF THE DRAWINGS

Other objects and advantages of the present invention will become apparent during the following discussion conjunction with the accompanying drawings, in which:

FIGS. 4(a)–4(d) are explanatory views illustrating an evaluating method of an integrated circuit fabricated by the fabricating method according to the second embodiment when the bonding layer is properly formed;

FIGS. 5(a)–5(d) are explanatory views illustrating an evaluating method of an integrated circuit fabricated by the fabricating method according to the second embodiment when the bonding layer has a defect;

FIGS. 6(a)–6(d) are explanatory view illustrating an evaluating method of an integrated circuit fabricated by the fabricating method according to the second embodiment when no eutectic bonding layer is formed;

FIGS. 8(a)–8(c) are explanatory views illustrating an evaluating method of an integrated circuit fabricated by the fabricating method according to the third embodiment;

FIGS. 9(A) and 9(B) are explanatory views illustrating a conventional die bonding (eutectic bonding); and FIG. 10 is a section view for explaining problems in the conventional die bonding.

DETAILED DESCRIPTION OF THE PREFERRED EMBODIMENTS

Preferred embodiments of the present invention will now be described with reference to the accompanying drawings.

First Embodiment

A fabricating method of an integrated circuit according to the first embodiment includes a step of processing a chip and a step of bonding the chip and a ceramic substrate actually so as to evaluate a bonding condition electrically.

Figure 1:
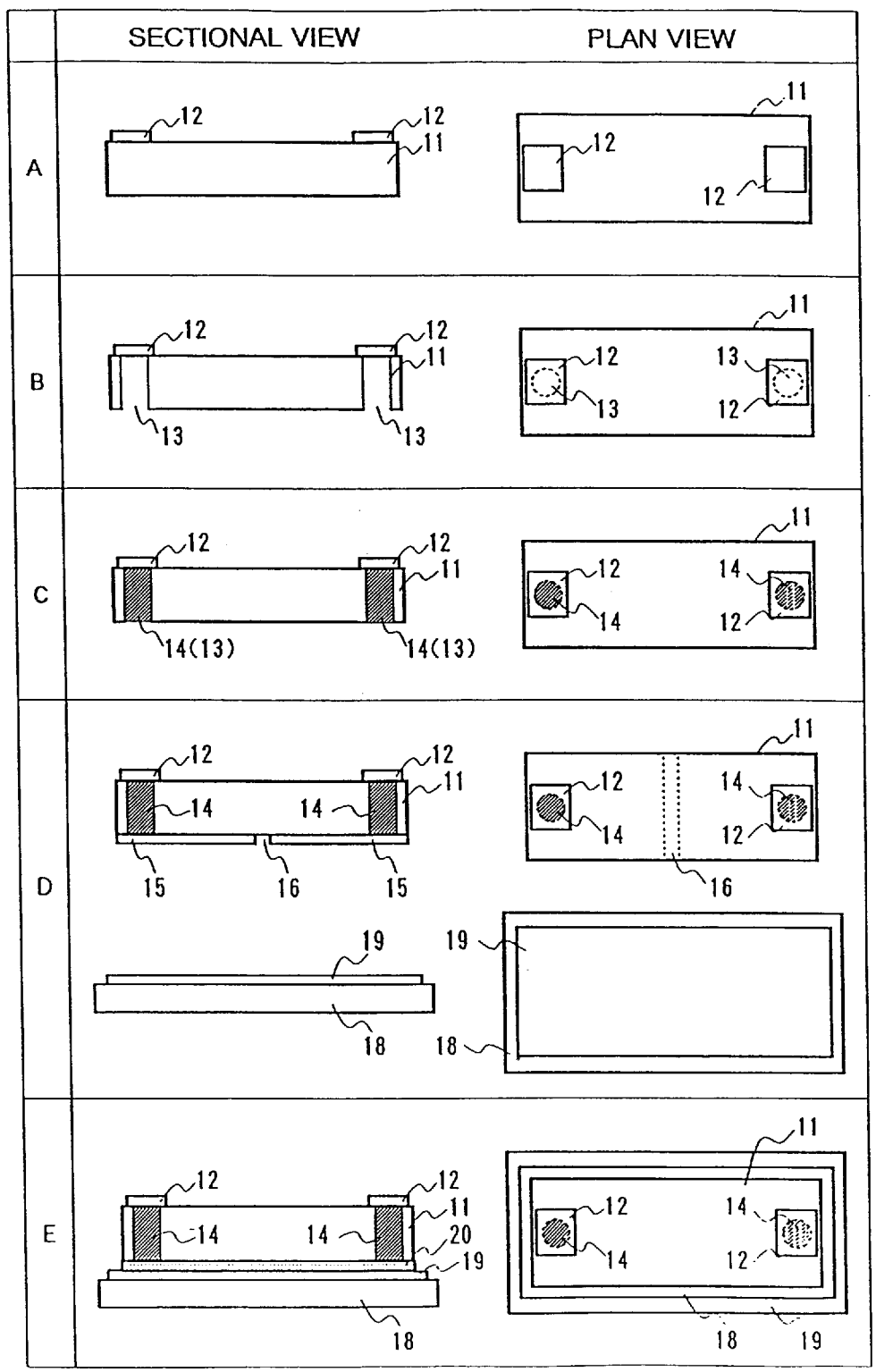
FIGS. 1(A) through 1(E) are step charts typically illustrating a fabricating method of an integrated circuit according to the first embodiment of the present invention.

A concrete explanation will be given of a fabricating method of an integrated circuit according to the first embodiment of the present invention with reference to FIGS. 1(A) through 1(E). As shown in FIG. 1(A), in this fabricating method, two external connecting electrodes 12 are formed on a surface of a chip 11. Additionally, in this embodiment, a chip (GaAsIC) in which an electronic circuit is fabricated on a GaAs substrate is used as the chip 11. The external connecting electrodes 12 are formed by forming a resist pattern in which there is no resist in preset areas for forming the external connecting electrodes 12 on the chip 11 by a photolithography method, thereafter, forming an Au (gold) film on the resist pattern by the vacuum evaporation method, and then removing the resist pattern (namely, lift-off method).

Then, a preformed resist pattern is formed on the rear face of the chip 11, and a dry etching is applied, whereby a structure in which via holes or throughbores 13 are formed below the respective external connecting electrodes 12 is, as shown in FIG. 1(B). Thereafter, each via hole 13 is filled up with conductive material so as to form a conductive portion 14 electrically connected with the external connecting electrode 12 (see FIG. 1(C)). In this embodiment, the via hole 13 is filled up with Al (aluminum) by a plating method so as to form the conductive portion 14.

As shown in FIG. 1(D), a first metal film 15 and a second metal film 19 for the eutectic bonding are respectively formed on the rear face of the chip 11 processed as above and the surface of the ceramic substrate 18. In this case, when the first metal film 15 is formed on the rear face of the chip 11, as shown in FIG. 1(D), a portion where there is no first metal film 15 (hereinafter, called a slit portion 16) is provided at the center of the chip 11 by the lift-off method. The width of the slit portion 16 is set in a manner that continuous eutectic alloy layers are formed when the process for forming a eutectic alloy between the first metal film 19 and the second metal film 15 is performed under a suitable condition. Additionally, in this embodiment, a vacuum evaporation film of Sn (tin) and of Au (gold) are respectively used as the first metal film 15 and the second film 19, and the width of the slit portion 16 is 0.01 mm.

Thereafter, the chip 11 and the ceramic substrate 18 are temporally heated with contact between the first metal film 15 and the second metal film 19, so that a structure in which a space between the chip 11 and the ceramic substrate 18 is filled and the chip 11 and substrate 18 bonded with an eutectic alloy layer 20 (see FIG. 1(E)).

Now, the width of the silt portion 16 is set to about 0.01 mm. The chip length (length in a direction perpendicular to the extending direction of the slit portion 16) is usually about 4 mm, so that a ratio of the slit portion 16 on which no first metal film 15 is formed to the rear face of the chip is about 1/400, namely, very small. This degree is that no influence is given to an alloy layer by the slit portion 16.

Next, an explanation will be given of the evaluating method of a bonding condition in an integrated circuit fabricated by this fabricating method.

Figure 2A:
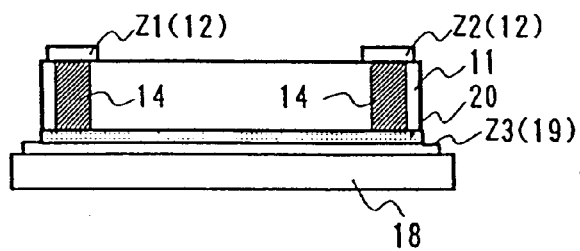
FIGS. 2(a) through 2(i) are explanatory views illustrating an evaluating method of an integrated circuit fabricated by the fabricating method according to the first embodiment.
Figure 2B:
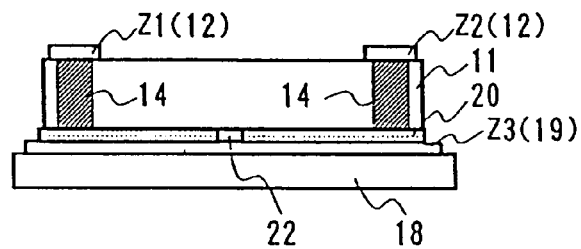
Figure 2C:
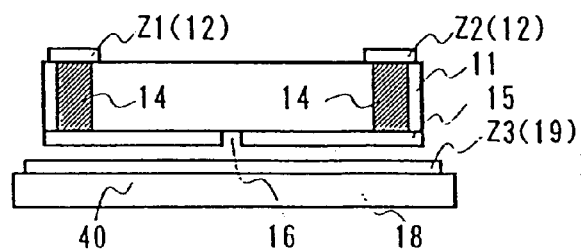
Figure 2D:
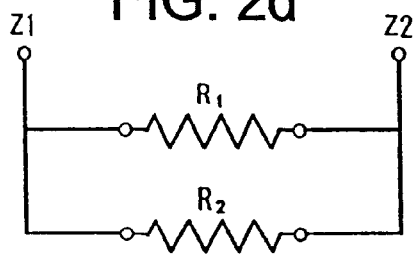

In this fabricating method, the metal film having the slit portion is formed on the rear face of the chip so that, when the eutectic alloy is normally formed, as shown in FIG. 2(a), a eutectic alloy layer exists in an area in which the slit portion 16 has been formed. When the eutectic alloy is formed under a condition which is different from an usual condition, as shown in FIG. 2(b), no eutectic alloy layer exists in an area which the slit portion 16 has existed or a part of the slit portion remains, whereby a defect such as a cavity 22 occurs. Moreover, as shown in FIG. 2(c) typically, there is a chance that no eutectic alloy layer is formed in an interface 40 between the first metal film 15 and the second metal film 19. That is, when the eutectic alloy is formed under a condition which is different from usual condition, a defect which prevents conductivity between the two external connecting electrodes 12 (hereinafter, called Z1, Z2) or between the external connecting electrode 12 and the second metal film 19 (hereinafter, called Z3 can occur).

Figure 2E:
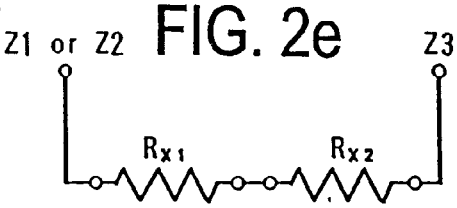
Figure 2F:
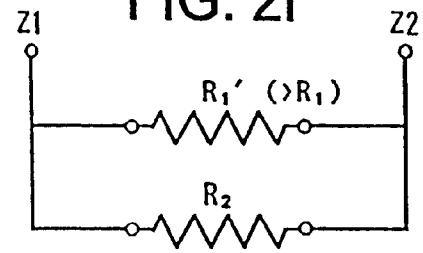
Figure 2G:
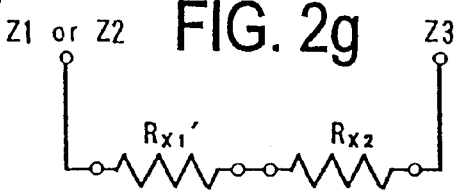
Figure 2H:
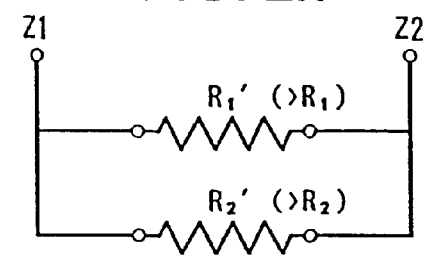
Figure 3:
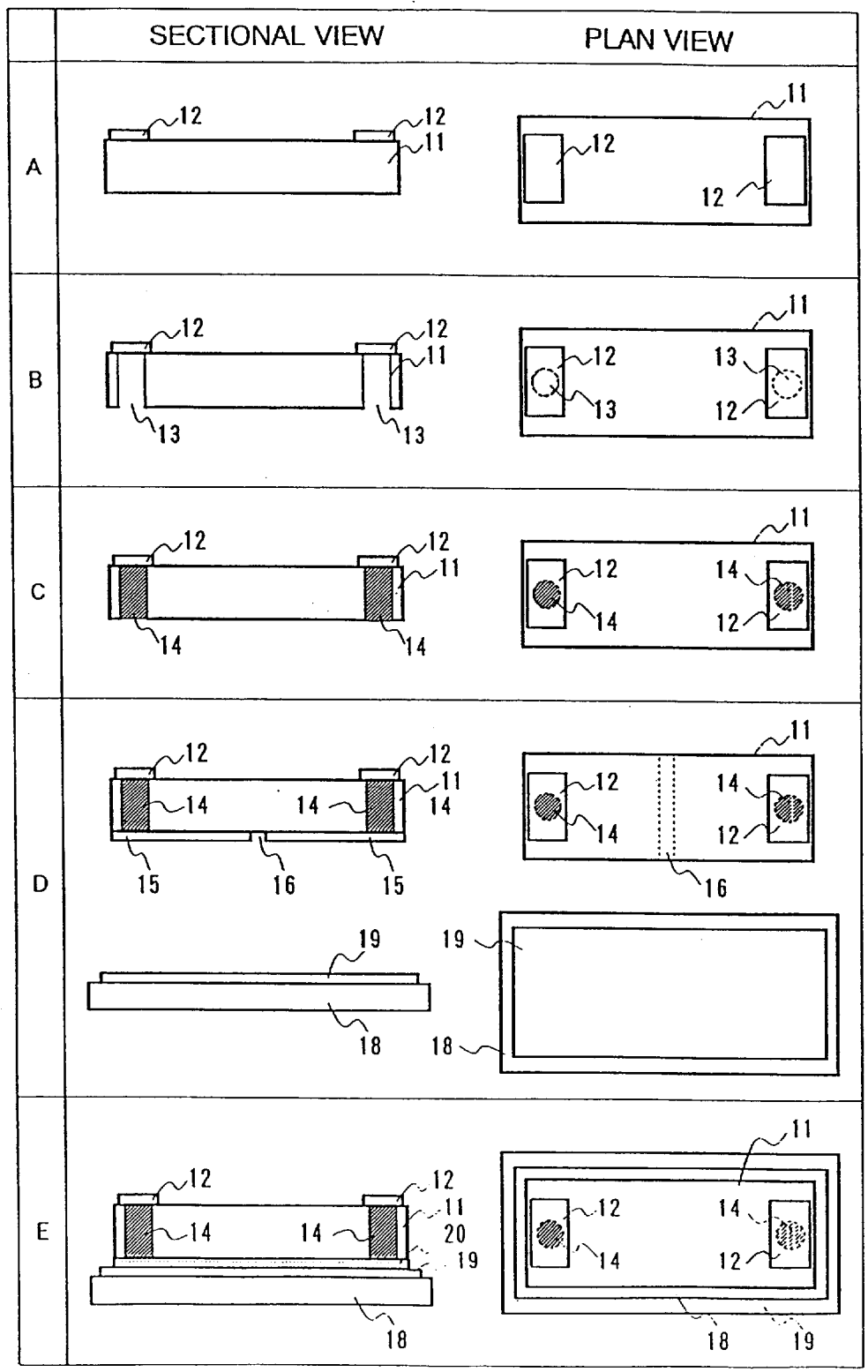
FIGS. 3(A) through 3(E) are step charts typically illustrating a fabricating method of an integrated circuit according to the second embodiment of the present invention.

Thus, when the bonding portion is formed normally, as shown in FIG. 2(a) typically, a resistance between the external connecting electrodes Z1, Z2 becomes a resistance $(R_1 \times R_2/(R_1+R_2))$ that is a resistance $R_1$ of the eutectic alloy layer 20 in the horizonal direction and a resistance $R_2$ of the second metal film 19 in the horizontal direction connected in parallel, as shown in FIG. 3(d) Alternately, resistance between the external connecting electrodes Z1, Z2 in a state shown in FIG. 2(b) becomes a resistance wherein a resistance $R_1'$, which is larger than the resistance $R_1$ and the resistance $R_2$ are connected in parallel as shown in FIG. 2(f). Moreover, a resistance between the external connecting electrodes Z1, Z2 in a state shown in FIG. 2(c) becomes a resistance wherein a resistance $R_1'$, which is larger than the resistance $R_1$ and a resistance $R_2'$ as shown in FIG. 2(h) which is larger than the resistance $R_2$ are connected in parallel as shown in FIG. 2(h).

As above described, a resistance value between the external connecting electrodes Z1, Z2 in a case that the bonding portion (eutectic alloy layer 20) is not formed normally is larger than that in a case that the bonding portion is formed normally. Thus, it can be determined whether the bonding is performed normally or not by measuring the resistance value.

Figure 2I:
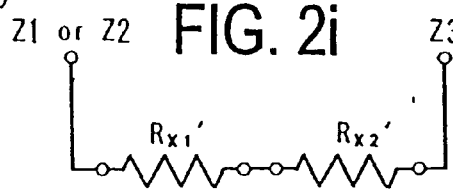

Similarly, when the bonding portion is formed normally, as shown in FIG. 2(a) typically, a resistance between the external connecting electrode Z1 or Z2 and the second metal film Z3 becomes a resistance ($R_{X1}+R_{X2}$), that, a resistance $R_{X1}$ of the eutectic alloy layer 20 in the longitudinal direction and a resistance $R_{X2}$ of the second metal film 19 in the longitudinal direction are connected in series, as shown in FIG. 2(e). On the other hand, a resistance between the external connecting electrode Z1 or Z2 and the second metal film Z3 in a state shown in FIG. 2(b) becomes a resistance wherein a resistance $R_{X1}'$, which is larger than the resistance $R_{X1}$ and the resistance $R_{X2}$ are connected in series as shown in FIG. 2(g). Moreover, a resistance between the external connecting electrode Z1 or Z2 and the second metal film Z3 in a state shown in FIG. 2(c) becomes a resistance wherein a resistance $R_{X1}'$, which is larger than the resistance $R_{X1}$, and a resistance $R_{X2}'$, which is larger than the resistance $R_{X2}$, are connected in series as shown in FIG. 2(i).

That is, a resistance value between the external connecting electrodes Z1 or Z2 and the second metal film Z3 in the case that the bonding portion (eutectic alloy layer 20) is not formed normally is larger than in the case that the bonding portion is formed normally. Thus, it can be determined whether the bonding is performed normally or not by measuring the resistance value.

Second Embodiment

In the fabricating method explained in the first embodiment, any material can be used for the first and second metal films, however, when the resistance of the eutectic alloy layer formed as the result is very small, an influence of a contact resistance between a probe for resistance measurement and the external connecting electrode becomes larger, and therefore, it becomes difficult to determine whether a bonding portion is formed normally or not.

In the fabricating method of the second embodiment, to solve those problems, as shown in FIG. 3(A) typically, the size of the external connecting electrodes 12 formed on the chip 11 is set in a manner such that two probes for resistance measurement can contact each electrode 12. The fabricating procedures after that are similar to those in the first embodiment, therefore, the explanation is omitted.

Then, when the integrated circuit is evaluated, as shown in FIGS. 4 through 6, two probes are touched to each external connecting electrode 12. That is, the external connecting electrodes 12 are respectively used as two electrodes (Z1 and Z3, Z2 and Z4), whereby the resistance (voltage drop between Z3 and Z4) in the bonding portion is measured by the four-terminal method. The bonding condition is determined based on the measured result.

That is, when the bonding portion is formed normally, as shown in FIGS. 4(a) and (b) typically, a voltage drop between the external connecting electrodes Z3 and Z4 is based on a resistance ($R_1 \times R_2/(R_1+R_2)$), that is a resistance $R_1$ of the eutectic alloy layer 20 in the horizontal direction and a resistance $R_2$ of the second metal film 19 in the horizontal direction are connected in parallel as shown in FIG. 4(c). On the other hand when the bonding portion is not formed normally, such as shown FIGS. 5(a) and (b), a voltage drop between the external connecting electrodes Z3, Z4 is based on a resistance wherein a resistance $R_1'$, which is larger than the resistance $R_1$ and the resistance $R_2$ are connected in parallel as shown in FIG. 5c. Moreover, as shown in FIGS. 6a and 6b, when no eutectic alloy layer is formed, a voltage drop between the external connecting electrodes Z4 and Z3 is based on a resistance wherein a resistance $R_1'$, which is larger than the resistance $R_1$, and a resistance $R_2'$, which is larger than the resistance $R_2$, are connected in parallel as shown in FIG. 6(c).

As above described, the voltage drop between the external connecting electrodes Z3 and Z4 in the case when the bonding portion (eutectic alloy layer 20) is not formed normally is different from that in the case where the bonding portion is formed normally. Thus, it can be determined whether the bonding is performed normally or not by measuring the voltage drop.

Similarly, when the bonding portion is formed normally, as shown in FIGS. 4(a) and 4(b) typically, a voltage drop between the external connecting electrode Z4 or Z3 and the second metal film Z6 is based on a resistance ($R_{X1}+R_{X2}$), that is a resistance $R_{X1}$ of the eutectic alloy layer 20 in the longitudinal direction and a resistance $R_{X2}$ of the second metal film 19 in the longitudinal direction connected in series as shown in FIG. 4d. On the other hand, a voltage drop between the external connecting electrode Z3 or Z4 and the second metal film Z6 in a state shown in FIGS. 5(a) and (b) is based on a resistance wherein a resistance $R_{X1}'$, which is larger than the resistance $R_{X1}$, and the resistance $R_{X2}$ are connected in series as shown in FIG. 5(d). Moreover, a voltage drop between the external connecting electrode Z4 or Z3 and the second metal film Z6 in a state shown in FIGS. 6(a) and (b) is based on a resistance wherein a resistance $R_{X1}'$, which is larger than the resistance $R_{X1}$, and a resistance $R_{X2}'$, which is larger than the resistance $R_{X2}$, are connected in series as shown in FIG. 6(d) larger than the resistance $R_{X2}$, are connected in series.

That is, a voltage drop between the external connecting electrodes Z4 or Z3 and the second metal film Z6 in the case that the bonding portion (eutectic alloy layer 20) is not formed normally is larger than that in the case where the bonding portion is formed normally. Thus, it can be determined whether the bonding is performed normally or not by measuring the voltage drop.

Third Embodiment

Figure 7:
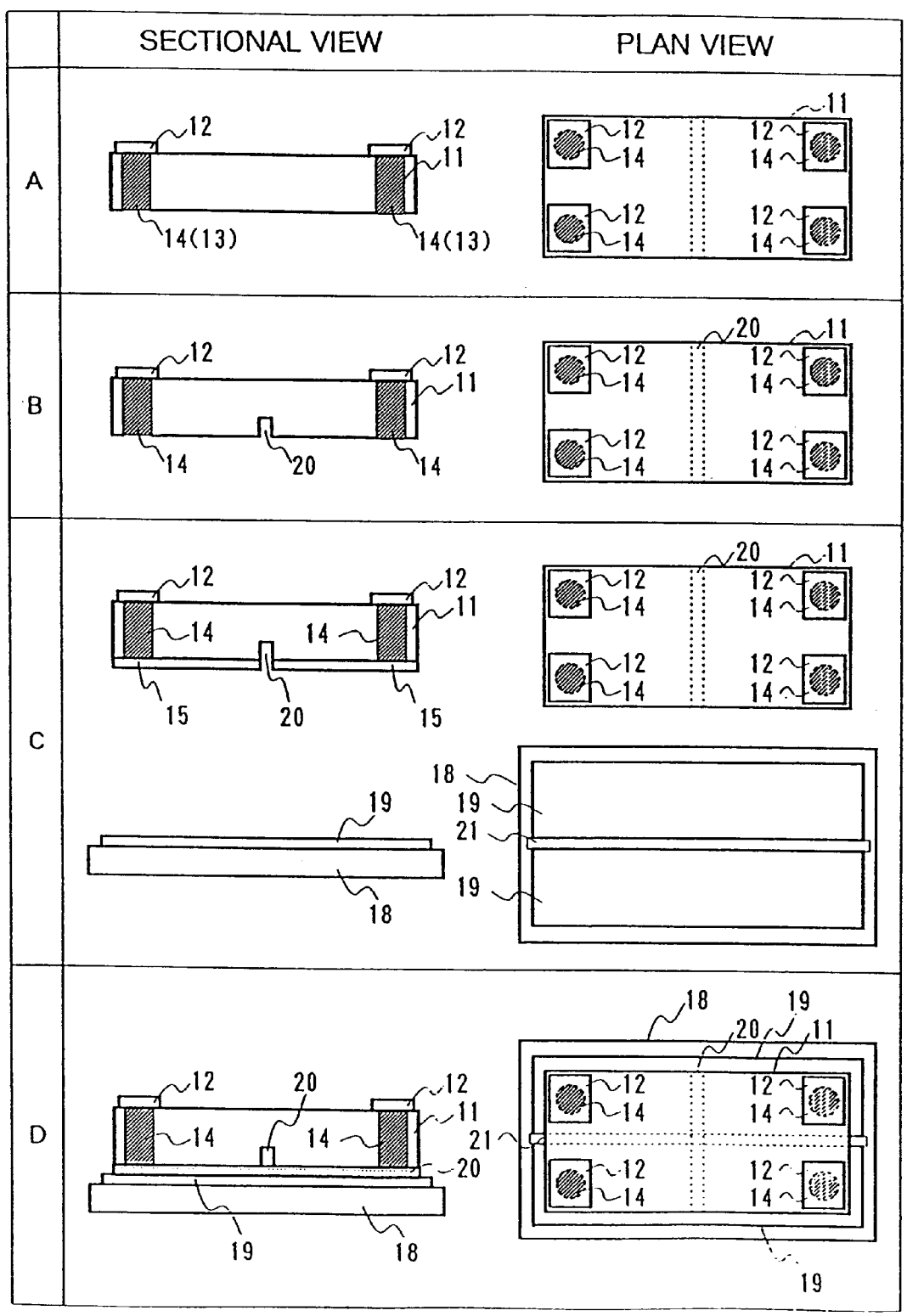
FIG. 7(A) through 7(D) are step charts typically illustrating a fabricating method of an integrated circuit according to the third embodiment of the present invention.

Next, a concrete explanation will be given of a fabricating method of an integrated circuit according to the third embodiment of the present invention with reference to FIG. 7.

In this fabricating method, first, with the same procedures in the first embodiment, the chip 11 is processed in a manner that four external connecting electrodes 12 and conductive portions 14 are provided (see FIG. 7(A)). Then, a preformed resist pattern is formed on the rear face of the chip 11, and the dry etching is performed, whereby, as shown in FIG. 7(B), a first groove 20 is formed in the center portion of the rear face of the chip 11. In this embodiment, the first groove 20 is formed to be 0.01 mm in width and 0.05 mm in depth.

Then, as shown in FIG. 7(C), a first metal film 15 for the eutectic bonding is formed on the rear face of the chip 11 which is processed as described above. Incidentally, no first metal film 15 exists in the groove 20.

Further, a preformed resist pattern is formed on the surface of the ceramic substrate 18, and the dry etching is performed, whereby, as shown in FIG. 7(C), a second groove 21 perpendicular to the first groove 20 is formed in the center portion of the ceramic substrate 18. Then, a second metal film 19 is formed on the as described above ceramic substrate 18 on which the second groove 21 is formed so as not to fill the second groove 21. Additionally, it is desirable that the second groove 21 is formed so as not to block the eutectic alloy, and therefore, in this embodiment, the second groove 21 is formed to be 0.01 mm in width and 0.05 mm in depth. The area ratio of the width of the groove 21 to the rear face of the chip is about 1/400 similarly to the silt portion in the first embodiment.

Then, the chip 11 and the ceramic substrate 18 are heated temporarily in a state that the first metal film 15 and the second metal film 19 are in contact, whereby a structure (see FIG. 7(D)) in which a space between the chip 11 and the ceramic substrate 18 is filled and in which the chip 11 and the substrate 18 are bonded with the eutectic alloy layer 20 is obtained.

Next, an explanation will be given of an evaluating method of a bonding condition in an integrated circuit fabricated by this fabricating method.

As is clear from the above-described fabricating steps, when the eutectic alloy is formed normally, layers whose borders are the first groove 20 and the second groove 21 and each of which has the same form and the same characteristic, are formed under the respective external connecting electrodes 12 (conductive portions 14) provided in the integrated circuit. Thus, as shown in FIGS. 8(a) and 8(b), a bridge circuit is structured by using the four external connecting electrodes 12 of the integrated circuit fabricated by this fabricating method, and when a voltage is applied to the external connecting electrodes Z1 and Z4, no current runs between the external connecting electrodes Z2 and Z3. That is, when the eutectic alloy is formed normally, the resistance values of the resistances R1–R4 between the respective external connecting electrodes become flat, and therefore, no current runs between the external connecting electrodes Z2 and Z3. On the contrary, when the eutectic alloy is not formed normally, the resistance values of the resistances R1–R4 between the respective external connecting electrodes is not flat, and therefore, a potential difference generated between the external connecting electrodes Z2 and Z3, so that a current corresponding to the state of the bonding portion runs between the external connecting electrodes Z2 and Z3. Thus, the bonding condition can be evaluated by measuring like this.

Additionally, although in each above-described embodiment, a GaAsIC is used, the fabricating method of the present invention can be also applied to an IC on a InP substrate, a Si on sapphire IC, and so on. In the first and second embodiments, the slit portion 16 is provided while the first metal film 15 is formed. Although a difference of the resistance values between a normal case and an abnormal case becomes small compared with that when the slit portion 16 is provided, the resistance value between the external connecting electrodes 12 also varies in accordance with the state of the bonding portion though no slit portion 16 is provided. Thus, though the fabricating method explained in each embodiment is performed without providing the slit portion 16, an integrated circuit in which a bonding condition can be simply evaluated can be also obtained. Moreover, in each embodiment, the explanation is given as to the eutectic alloy method, however, each embodiment may be applied to the solder bonding.

As above explained in detail, an integrated circuit can be determined electrically about a bonding condition between a chip and a ceramic substrate. Therefore, all integrated circuits are fabricated in accordance with the present invention, whereby it can be simply determined whether all of them are inferior or not.

According to the fabricating method of the present invention, an integrated for circuit which a bonding condition (a condition of a conductive member) between a chip and a ceramic substrate can evaluated is obtained, and therefore, it can be simply determined whether the fabricated integrated circuit is inferior or not. Particularly, when a slit-shaped portion is formed, a difference between the resistances in the bonding portion of the integrated circuit fabricated in a case wherein the bonding is performed not normally by any cause, and in a case wherein the bonding is performed normally can be made larger, and therefore it can be more easily determined whether the integrated circuit is inferior or not.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. A method of fabricating an integrated circuit including a semiconductor chip having active elements on a main face, and a substrate having an electrode on a main face; said method comprising the steps of:

forming at least two surface electrodes on the main face of the semiconductor chip;

forming connection wiring portions by making holes penetrating the semiconductor chip from a rear face opposite to the main face, to the surface electrodes on the main surface and filling the holes with conductive materials;

forming two separated conductive members on the rear face of the semiconductor chip to provide electrical contact to the respective connection wiring portion; and bonding the semiconductor chip with the substrate by placing the semiconductor chip on the substrate such the respective conductive members on the rear face of the semiconductor chip are opposite and in contact with the electrode on the main face of the substrate, and, then heating the semiconductor chip, and the substrate to electrically and mechanically connect one of the surface electrodes of the chip to the other surface electrode of the chip via the respective conductive members, the respective wiring portions and the surface electrode of the substrate.

2. A method of fabricating an integrated circuit according to the claim 1, wherein each of the two surface electrodes is provided with an area capable of being touched with at least two external terminals.

3. A method of fabricating an integrated circuit including a semiconductor chip having active elements on a main face and a substrate having electrodes on a main face; said method comprising the steps of:

forming four surface electrodes on the main face of the semiconductor chip;

forming connection wiring portions by making holes penetrating the semiconductor chip from a rear face opposite to the main face to the surface electrodes and filling the holes with conductive materials;

forming a groove portion dividing the surface of the rear face of the semiconductor into two;

providing conductive members on the rear face of the semiconductor chip expect for the groove portion;

forming the electrodes on the main face of the substrate in a manner that surface of the main face of the substrate is separated into two parts extending in a direction perpendicular to the groove portion; and bonding the semiconductor chip and the substrate by putting the semiconductor chip on the substrate in a manner that the rear face of the semiconductor chip is opposite to the main face of the substrate and heating them.

4. A method of fabricating an integrated circuit including a semiconductor chip having active elements on a main surface, and a substrate having an electrode on a main surface, said method comprising the steps of:

forming at least two surface electrodes on the main surface of the semiconductor chip;

forming connection wiring portions by making holes penetrating the semiconductor chip from a rear surface, opposite to the main surface, to the surface electrodes on the main surface, and filling the holes with conductive material;

forming a respective conductive member so as to provide contact between the respective conductive material in the holes and the electrode of the substrate; and heating the semiconductor chip and the substrate to cause one of the surface electrodes of the semiconductor chip to be electrically connecting to the other of the surface electrodes of the semiconductor chip via the conductive material in the respective holes, the respective conductive members, and the electrode on the main surface of the substrate.

5. A method of fabricating an integrated circuit according to claim 4, wherein each of the two surface electrodes on the semiconductor chip is provided with an area capable of being touched with at least two external terminals.

* * * * *